US008828186B2

(12) United States Patent
Konno et al.

(10) Patent No.: US 8,828,186 B2
(45) Date of Patent: Sep. 9, 2014

(54) METHOD AND APPARATUS FOR PEELING ELECTRONIC COMPONENT

(75) Inventors: Yoshito Konno, Kawasaki (JP); Yutaka Yamada, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 756 days.

(21) Appl. No.: 12/410,712

(22) Filed: Mar. 25, 2009

(65) Prior Publication Data
US 2009/0242124 A1  Oct. 1, 2009

(30) Foreign Application Priority Data

Mar. 26, 2008  (JP) ................ 2008-080734

(51) Int. Cl.
*B29C 63/00* (2006.01)
*H01L 21/683* (2006.01)
*H01L 21/67* (2006.01)

(52) U.S. Cl.
CPC ...... *H01L 21/67132* (2013.01); *H01L 21/6838* (2013.01); *H01L 21/67011* (2013.01)
USPC ........... 156/707; 156/719; 156/714; 156/758; 156/764; 156/709

(58) Field of Classification Search
CPC ..... H01L 21/52; H01L 21/46; H01L 21/6838; H01L 21/67; H01L 21/78
USPC .......................... 156/584, 758, 764, 344, 707
See application file for complete search history.

(56) References Cited

U.S. PATENT DOCUMENTS

| 4,813,732 | A | * | 3/1989 | Klem | 294/103.1 |
| 5,803,797 | A | * | 9/1998 | Piper | 451/182 |
| 6,257,966 | B1 | * | 7/2001 | Ishikawa et al. | 451/67 |
| 6,406,940 | B1 | * | 6/2002 | Chen | 438/109 |
| 6,629,553 | B2 | * | 10/2003 | Odashima et al. | 156/765 |
| 6,824,643 | B2 | | 11/2004 | Yoshimoto et al. | |
| 2006/0052037 | A1 | | 3/2006 | Izumi et al. | |
| 2009/0279995 | A1 | * | 11/2009 | Haji et al. | 414/752.1 |

FOREIGN PATENT DOCUMENTS

| JP | 6-085060 A | 3/1994 |
| JP | 6-97212 A | 4/1994 |
| JP | 11-297793 A | 10/1999 |
| JP | 2007-109936 A | 4/2007 |
| JP | 2009-071195 A | 4/2009 |
| WO | WO 2007043654 A1 * | 4/2007 |

OTHER PUBLICATIONS

Japanese Office Action dated Oct. 18, 2011, issued in corresponding Japanese Patent Application No. 2008080734.(partial translation).

(Continued)

*Primary Examiner* — Philip Tucker
*Assistant Examiner* — Alex Efta
(74) *Attorney, Agent, or Firm* — Westerman, Hattori, Daniels & Adrian, LLP

(57) ABSTRACT

A method of peeling an electronic component. The method includes a step of, when the electronic component is adhered onto a first main surface of a tape member, bringing a bellowphragm into contact with a second main surface, which is the other main surface of the tape member; and a step of, after the bellowphragm is brought into contact with the second main face, deforming the bellowphragm and the tape member by supplying a fluid to the bellowphragm to thereby peel the electronic component from the tape member.

10 Claims, 12 Drawing Sheets

(56) References Cited

OTHER PUBLICATIONS

U.S. Office Action dated Jan. 6, 2014, issued in corresponding U.S. Appl. No. 13/588,506, (19 pages).

U.S. Office Action Dated May 30, 2014, issued in U.S. Appl. No. 13/588,506 (22 pages).

* cited by examiner

METHOD AND APPARATUS FOR PEELING ELECTRONIC COMPONENT

CROSS REFERENCE TO RELATED APPLICATION

This application is based upon and claims the benefit of priority from the prior Japanese Patent Application NO. 2008-80734 filed on Mar. 26, 2008, the entire contents of which are incorporated herein by reference.

BACKGROUND

1. Field

The embodiments discussed herein are relates to a method and apparatus for peeling an electronic component.

2. Description of the Related Art

In a process of manufacturing a semiconductor device such as a semiconductor integrated circuit device, a so-called dicing process (segmentation process) is performed to separate multiple semiconductor elements (semiconductor integrated circuit elements), which are formed on a single piece of semiconductor substrate (wafer) through a so-called wafer process, into multiple pieces.

That is, in the process of manufacturing a semiconductor device, multiple semiconductor elements, each having an electronic circuit formed of an active element such as a transistor, a passive element such as a resistance element or a capacitive element, and a wiring layer that connects these functional elements on one of main surfaces of a semiconductor substrate such as a silicon (Si), are formed through a so-called wafer process.

Then, a grinding process is performed on the other surface (rear surface, on which no electronic circuit is formed) of the semiconductor substrate to reduce the thickness of the semiconductor substrate.

Furthermore, a so-called dicing process is performed on the semiconductor substrate, so that the semiconductor substrate is separated (segmented) into the individual semiconductor elements.

Each of the segmented semiconductor elements (semiconductor chips) is transported directly or transported with placed on a tray, or the like, mounted on a support member such as a wiring substrate or a lead frame, and then connected to an electrode or a lead wire and sealed, thus forming a semiconductor device.

In the manufacturing process, the dicing process fixes the other main surface of a processed semiconductor substrate by adhering the other main surface onto a tape whose surface is adhesive and, in the above state, separates (segments) the semiconductor substrate into separate semiconductor elements through a dicing blade method or a laser dicing method.

Note that the tape that is employed in the dicing process is called a dicing tape; however, another method in which a dicing tape is not adhesive and a semiconductor substrate is fixed onto the dicing tape through an adhesive tape may be employed.

The segmented semiconductor element is pressed (pushed up) with a pressing jig from the rear surface of the dicing tape while the upper surface of the semiconductor element is vacuumed and held by a vacuum jig (vacuum collet), thus being peeled off from the dicing tape.

The semiconductor element held by the vacuum jig is, for example, placed on a transport tray as described above and then transported to the next process such as a mounting process to a circuit substrate.

In an existing art, a processing method and processing apparatus for picking up the semiconductor elements from the dicing tape after the dicing process employ the configuration shown in FIG. 1, for example.

That is, a dicing tape 21 to which multiple semiconductor elements 1 that are segmented through the dicing process are adhered is set to a processing apparatus 100, and the semiconductor element is pushed up from the rear surface of the dicing tape 21 by a push-up jig 3 one by one. This reduces an area in which the semiconductor element 1 is adhered to the dicing tape 21.

In addition, in association with the push-up operation, the semiconductor element 1 is vacuumed and held by a vacuum jig (vacuum collet) 4 at its upper surface and is raised, thus being peeled from the dicing tape 21.

The push-up jig 3 has a flat portion 31 that has dimensions substantially corresponding to the outside dimensions of the semiconductor element 1 and a cylindrical wall portion 32 that surrounds the flat portion. The flat portion 31 has a plurality of through-holes 33.

Then, in correspondence with the through-holes 33, a plurality of needles 34 are held by a needle support portion 35 so as to be movable vertically (indicated by arrow P). In a state where the flat portion 32 is in contact with the dicing tape 21, vacuuming is performed through the through-holes 33 to thereby fix the dicing tape 21.

In such a state, the needle support portion 35 is raised to make the needles 34 pass through the through-holes 33 and then press the dicing tape 21 or extend through the dicing tape 21 to thereby press the rear surface of the semiconductor element 1.

On the other hand, in correspondence with the push-up jig 3, a vacuum jig 4 is arranged above the target semiconductor element 1 so as to be movable vertically (indicated by arrow Q).

The vacuum jig 4 may also be called a vacuum collet, and a vacuum opening 41 thereof is connected to a vacuum suction device (not shown).

In the processing apparatus 100, a process of peeling the semiconductor element 1 from the dicing tape 21 is performed as follows.

That is, the target semiconductor element 1 held on the dicing tape 21 is located directly above the push-up jig 3, and the vacuum jig 4 is located directly above that semiconductor element 1.

Subsequently, the push-up jig 3 is placed in proximity to the dicing tape 21, the dicing tape 21 is vacuumed through the through-holes 33 formed in the push-up jig 3 to thereby fixes the dicing tape 21 on the flat portion 31.

In such a state, the needle support portion 35 is raised, to make the needles 34 pass through the through-holes 33 and then press the dicing tape 21 or extend through the dicing tape 21 to thereby press the rear surface of the semiconductor element 1.

Thus, the semiconductor element 1 is peeled off from the surface of the dicing tape 21.

In association with the peeling operation, the vacuum jig 4 is lowered and vacuums the semiconductor element 1 through the vacuum opening 41, and then the vacuum jig 4 is raised while holding the semiconductor element 1.

Then, the vacuum jig 4 transports the semiconductor element 1 to a transport tray, and the like.

Japanese Laid-open Patent Publication No. 11-297793 discloses push-up manners using the plurality of needles, push-up pins located at substantially the center portion of the semiconductor element and push-up pins located around the center push-up pins are pushed up (pressed up) at a time interval to thereby make it easy to peel the semiconductor element from the dicing tape. In addition, Japanese Laid-open Patent Publication No. 6-85060 discloses another means, an adhesive sheet on the upper surface of which multiple semiconductor elements are adhered is tensioned to a stretched ring, each of the multiple semiconductor elements is pressed by a pressing block having a planar pressing surface from the lower surface of the adhesive sheet without breaking the adhesive sheet to thereby peel the individual semiconductor elements from the adhesive sheet. Furthermore, Japanese Laid-open Patent Publication No. 2007-109936 discloses further another means, the semiconductor element is pressed from the rear surface of an adhesive sheet, on the upper surface of which multiple semiconductor elements are adhered, using a sheet pressing member formed of a flexible elastic body such as rubber formed in a spherical shape without breaking the adhesive sheet, to thereby peel the individual semiconductor elements from the adhesive sheet.

The process of peeling the semiconductor element 1 from the dicing tape 21 in the processing apparatus 100 shown in FIG. 1 performs pressing the back surface of the target semiconductor element 1 with the plurality of needles 34.

Thus, the semiconductor element 1 will have portions that are directly pressed by the needles 34 and portions that are not pressed by the needles 34. This provides a state in which the semiconductor element 1 is peeled nonuniformly from the dicing tape 21 and, as a result, it is likely that the contact surface of the semiconductor element 1 with the dicing tape 21 is peeled nonuniformly.

For this reason, a peeled form is unstable and, therefore, the semiconductor element 1 may not be vacuumed and held by the vacuum jig 4.

In addition, according to the above means, it is necessary that the positions (levels) of the distal end portions of the plurality of needles 34 are equal. That is, if the positions of the distal end portions of the plurality of needles 34 are not equal due to abrasion or bending of the distal end portions, it is difficult to apply a uniform pressing force to the contact surface of the target semiconductor element 1 with the dicing tape 21.

In this way, if the positions of the distal end portions of the plurality of needles 34 are not equal, cracking, or the like, may possibly arise in the semiconductor element 1.

Moreover, it is extremely difficult to visually inspect the condition of the distal end portions of the plurality of needles 34. Thus, in the processing apparatus 100 having the above configuration, it is difficult to stably perform the process of peeling the semiconductor element 1 from the dicing tape 21.

The above problem also applies to the technology described in Japanese Laid-open Patent Publication No. 11-297793 that similarly uses a plurality of push-up pins.

In addition, in the technology described in Japanese Laid-open Patent Publication No. 11-297793, because push-up (pressing) operation is performed at a time interval between push-up pins that are located at substantially the center portion of the semiconductor element and push-up pins that are located around substantially the center portion, it may be easy to peel the semiconductor element from the dicing tape; however, there still exits the influence on the semiconductor element due to the shape of the distal end of the push-up pin, nonuniform positions of the distal end portions, and the like.

On the other hand, in the technology described in Japanese Laid-open Patent Publication No. 6-85060, the process of peeling the semiconductor element from the dicing tape is performed using a pressing block on the upper surface of which a plurality of cones are arranged or a pressing block whose upper surface forms a polyhedron; however, an area in which the dicing tape is in contact with the semiconductor element is large even after the push-up operation and, therefore, it is difficult to peel the semiconductor element.

Then, in the technology described in Japanese Laid-open Patent Publication No. 2007-109936, a sheet pressing member formed of a flexible elastic body in a spherical shape is used, the process of peeling a chip from the sheet is performed so that the sheet pressing member elastically deforms, that is, the upper surface of the sheet pressing member deforms from a flat surface to a spherical surface.

At this time, in the above processing method, when the upper surface of the sheet pressing member is changed from a spherical shape to a flat surface in advance, a porous vacuum plate of a pick-up nozzle is brought into contact with a chip and a pressure is applied to a sheet pressing member across a sheet located beneath the chip. That is, at the time of initiation of pressurization, the chip is pressed by the sheet pressing member with an extremely small area. Thus, particularly when a chip has a relatively large area and a small thickness, cracking or chipping is likely to arise in the chip.

On the other hand, in response to a request for miniaturization and high performance of an electronic apparatus, further high performance is also required for the semiconductor element 1. This increases a chip size, whereas a further reduction in thickness of the chip, that is, a thin chip, is sought.

In this way, when a semiconductor element that is thinned while being increased in size (increased in area) and, as a result, decreased in mechanical strength is peeled from the dicing tape, a further careful execution of the peeling process is necessary so as not to bring about a breakage.

SUMMARY

One aspect of an embodiment provides a method of peeling an electronic component. The method includes a step of, when the electronic component is adhered onto a first main surface of a tape member, bringing a bellowphragm into contact with a second main surface, which is the other main surface of the tape member; and a step of, after the bellowphragm is brought into contact with the second main face, deforming the bellowphragm and the tape member by supplying a fluid to the bellowphragm to thereby peel the electronic component from the tape member.

Another aspect of the embodiment of the invention provides a peeling apparatus for an electronic component that is adhered onto a tape member. The peeling apparatus includes: a bellowphragm that is arranged on a side of the tape member, opposite to a side on which the electronic component is provided; a tape vacuum portion that is arranged around the bellowphragm and that vacuums the tape member; and a fluid supply device that supplies a fluid to the bellowphragm to deform the bellowphragm to thereby peel the electronic component from the tape member.

The object and advantages of the embodiments will be realized and attained by means of the elements and combinations particularly pointed out in the claims.

It is to be understood that both the foregoing general description and the following detailed description and are exemplary and explanatory and are not restrictive of the embodiments, as claimed.

DESCRIPTION OF EMBODIMENTS

Hereinafter, an embodiment of the invention will be described using a semiconductor element as a target electronic component and a dicing tape as a tape member.

Here, the configuration of a peeling apparatus for an electronic component will be described first, and a method of the peeling process using the peeling apparatus will be described second.

1. Peeling Apparatus for Electronic Component

Figure 1:
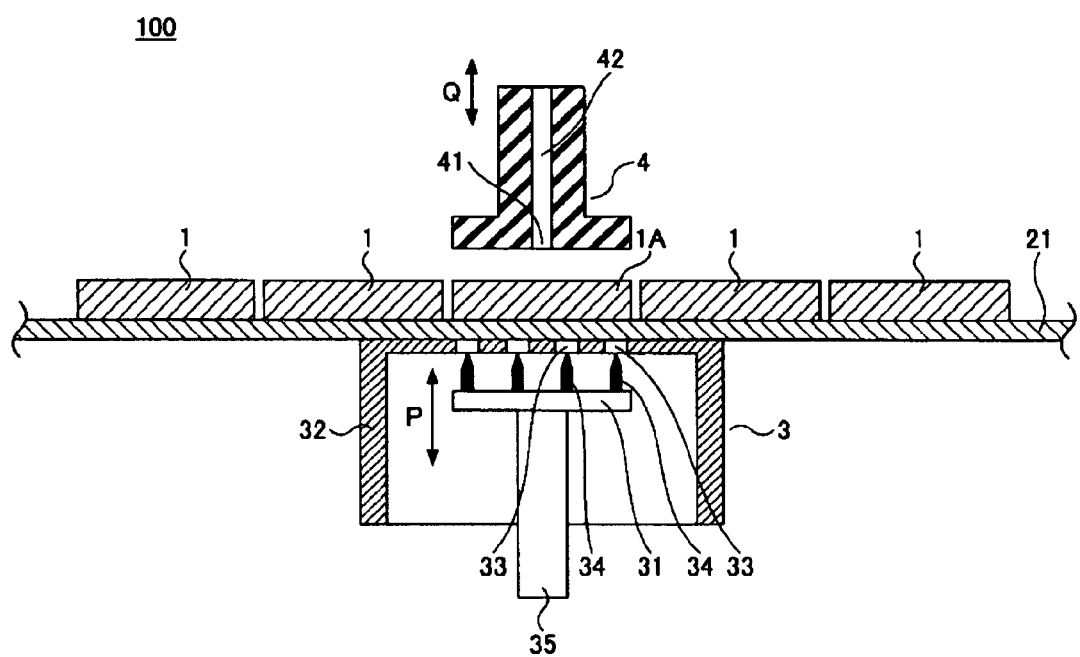
FIG. 1 is a view that shows the schematic configuration of an existing peeling apparatus.
Figure 2:
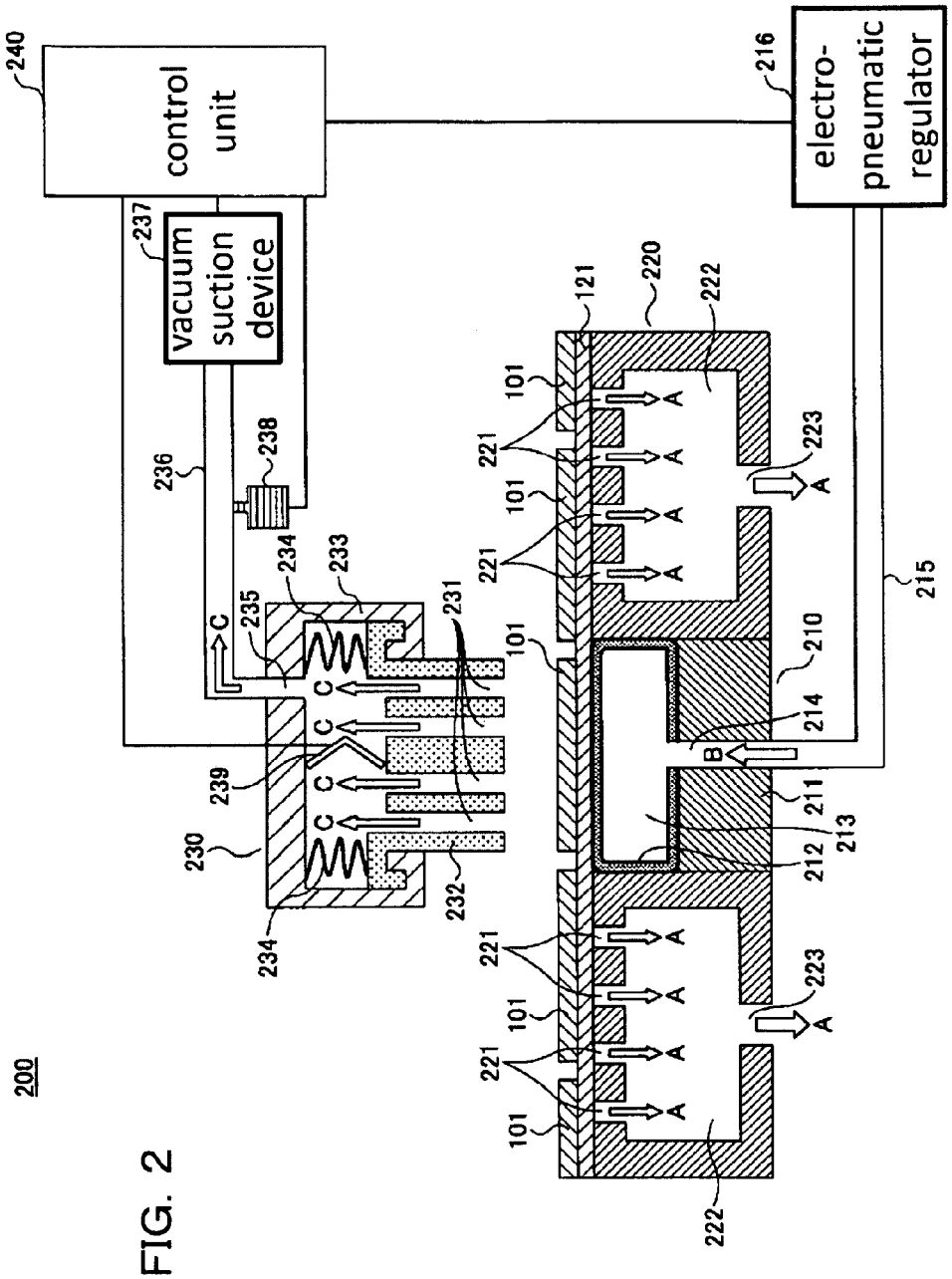
FIG. 2 is a view that shows the schematic configuration of a peeling apparatus for an electronic component according to an embodiment.

FIG. 2 shows the configuration of a peeling apparatus 200 for an electronic component according to the aspects of the invention.

That is, the peeling apparatus 200 for an electronic component includes a bellowphragm accommodating portion 210, a tape vacuum portion 220 that is arranged around the bellowphragm accommodating portion 210 so as to surround the bellowphragm accommodating portion 210, a vacuum unit 230 that is arranged above the bellowphragm accommodating portion 210, and a control unit 240 that controls these mechanisms.

In the above configuration, in the bellowphragm accommodating portion 210, in correspondence with a planar shape of a target electronic component, a bellowphragm 212 formed of an elastic body such as rubber is arranged on a base portion 211 whose upper surface has a rectangular shape in plan view.

The planar shapes of the base portion 211 and bellowphragm 212 are set in correspondence with the planar shape of the target electronic component. When the electronic component is a typical semiconductor element, the planar shapes are set to a rectangular shape.

In addition, the dimensions of each planar shape are substantially equal to those of the target electronic component and is set to a size that is slightly larger than that of the target electronic component. Then, an air chamber (bellowphragm air chamber) 213 of the bellowphragm 212 is connected to an electropneumatic regulator 216 through a through-hole 214 that extends through the base portion 211 and a pipe 215 that communicates with the through-hole 214.

In addition, the tape vacuum portion 220 that is arranged to surround the bellowphragm accommodating portion 210 has a plurality of through-holes 221 at its upper face for vacuuming a tape. The through-holes 221 communicate with a cavity portion 222 and are connected through a lower through-hole 223 and further through a pipe (not shown), and the like, to a vacuum suction device (not shown).

Note that the tape vacuum portion 220 may be formed as one block around the bellowphragm accommodating portion 210 or may be configured to be separated into a plurality of blocks that are respectively connected to a vacuum suction device.

In addition, a vacuum unit 230 is arranged above the bellowphragm accommodating portion 210 and includes an electronic component vacuum portion 232 and a box-shaped support portion 233. The electronic component vacuum portion 232 has a plurality of through-holes 231 that vacuum a vacuumed target electronic component. The support portion 233 elastically supports the electronic component vacuum portion 232. The vacuum unit 230 is supported by a support arm (not shown) so as to be vertically movable and rotatable.

The electronic component vacuum portion 232 is fitted in the support portion 233 and is elastically supported by springs 234.

The support portion 233 is connected through an opening 235 and a pipe 236 to a vacuum suction device 237. Then, a differential pressure detector (vacuum state detector) 238 is arranged in the pipe 236.

In addition, inside the support portion 233, a strain gauge 239, which serves as a contact force detector, is arranged between the support portion 233 and the electronic component vacuum portion 232.

Note that the electronic component vacuum portion 232 is not limited to a form that has the plurality of through-holes 231, but it may be configured as a plate-like member made of a porous material.

On the other hand, the shape and area of an opposite portion (contact portion) of the electronic component vacuum portion 232 to the vacuumed target electronic component are in correspondence with the shape and area of a vacuumed surface of the vacuumed target electronic component. As the electronic component is vacuumed, the plurality of through-holes 231 are all closed by the electronic component.

Then, the electropneumatic regulator 216, the vacuum suction device 237, the differential pressure detector 238 and the strain gauge 239 are connected to the control unit 240 and are controlled by the control unit 240.

In the thus configured peeling apparatus 200, before initiation of the peeling process, the level of the upper surface of the bellowphragm 212 is set so that the upper surface of the bellowphragm 212 and the upper surface of the tape vacuum portion 220 arranged around the bellowphragm 212 have substantially the same level and form a continuous plane.

Then, the sheet-like dicing tape 121 on which multiple semiconductor elements 101, which are processed targets, are adhered on one of the main surfaces is placed on a plane formed by the upper surface of the tape vacuum portion 220 and the upper surface of the bellowphragm 212 in such an orientation that the one of the main surfaces is placed as an upper surface, that is, a surface adhered to the semiconductor element 101 is placed as an upper surface.

Then, the dicing tape 121 is arranged so that one of the target semiconductor elements is located on the bellowphragm 212.

Here, semiconductor elements that are segmented from a semiconductor substrate of which the amount removed by back surface grinding (grinded amount) is small, that is, the thickness is relatively large, are adhered on the dicing tape 121 as the target semiconductor elements 101.

Then, the dicing tape 121 whose surface is adhesive is employed, and the semiconductor elements 101 peeled from the dicing tape 121 are fixed to a support substrate such as a wiring substrate or an interposer via an adhesive agent that is arranged in advance.

Vacuuming is performed at the tape vacuum portion 220 on the dicing tape 121 on which the multiple semiconductor elements 101 are adhered and which is placed on a plane formed by the upper surface of the bellowphragm 212 and the upper surface of the tape vacuum portion 220 arranged therearound. Thus, the dicing tape 121 is vacuumed and held on the tape vacuum portion 220. That is, a vacuum suction process is performed in a direction indicated by arrows A in the drawing.

Subsequently, pressurized air is introduced (arrow B in the drawing) from the electropneumatic regulator 216 into the air chamber 213 of the bellowphragm 212 located below the dicing tape 121 to thereby expand the bellowphragm 212.

At this time, because the bellowphragm 212 is surrounded by the tape vacuum portion 220, the bellowphragm 212 expands in a convex shape toward the dicing tape 121.

In accordance with expansion of the bellowphragm 212, the dicing tape 121 is pushed up and curved in correspondence with the shape of the bellowphragm 212.

The dicing tape 121 is pushed up in a substantially semispherical shape, and the surface thereof is curved, so that a force that exceeds an adhesive strength between the semiconductor element 101, which is pushed up with the dicing tape 121, and the dicing tape 121 is applied. Thus, the semiconductor element 101 initiates peeling from the dicing tape 121 at its outer peripheral portions, particularly, in proximity to its four corners.

At this time, the vacuum unit 230 is controlled by the control unit 240, arranged directly above the semiconductor element 101 and will be lowered. Then, the electronic component vacuum portion 232 is located in proximity to the upper surface of the semiconductor element 101 that is pushed up together with the dicing tape 121.

At this time, the vacuum suction device 237 is also driven by the control unit 240, and vacuuming (arrow C in the drawing) is initiated.

As the electronic component vacuum portion 232 is located in proximity to the semiconductor element 101 and, then, the electronic component vacuum portion 232 contacts the semiconductor element 101, the contact is detected by the strain gauge 239, and the detected result is transmitted to the control unit 240.

Then, when the electronic component vacuum portion 232 further approaches the semiconductor element 101 and establishes an appropriate contact state, that is, the upper surface of the semiconductor element 101 contacts the electronic component vacuum portion 232 in a substantially parallel relation to each other, all the through-holes 231 formed in the electronic component vacuum portion 232 are covered with the semiconductor element 101. That is, the semiconductor element 101 is vacuumed to the electronic component vacuum portion 232. As a result, a pressure in the support portion 233 of the vacuum unit 230 decreases.

The above pressure variation is detected by the differential pressure detector 238. This means that it is detected that the semiconductor element 101 is vacuumed to the electronic component vacuum portion 232.

On the basis of the above detected result, the vacuum unit 230 rises while vacuuming and holding the semiconductor element 10 on the through-holes 231 of the electronic component vacuum portion 232.

As the vacuum unit 230 rises, the semiconductor element 101 that is vacuumed and held on the electronic component vacuum portion 232 is peeled off from the dicing tape 121, thus being separated from the dicing tape 121.

After that, the vacuum unit 230 is moved by a support arm on the basis of a control signal from the control unit 240, and transfers the semiconductor element 101 to a transport tray (not shown), or the like.

As the semiconductor element 101 is peeled off from the dicing tape 121, the electropneumatic regulator 216 is controlled on the basis of a control signal from the control unit 240. Thus, a pressure in the air chamber 213 of the bellowphragm 212 is decreased, the bellowphragm 212 contracts, and the level of the bellowphragm 212 is lowered.

Then, the upper surface of the bellowphragm 212 is set to be equal in level to the upper surface of the tape vacuum portion 220.

In such a state, the bellowphragm accommodating portion 210, the tape vacuum portion 220 and the vacuum unit 230 are moved along the plane formed by the dicing tape 121, or the dicing tape 121 is moved on the plane formed by the bellowphragm accommodating portion 210 and the tape vacuum portion 220. Thus, the next target semiconductor element is placed on the bellowphragm 212.

Then, along the above described procedure, the process of peeling the semiconductor element from the dicing tape is performed.

Note that when it occurs that the semiconductor element is not vacuumed to the electronic component vacuum portion 232 in an appropriate contact state, for example, portion of the semiconductor element contacts the electronic component vacuum portion 232 and then the entire upper surface of the semiconductor element is not in contact with the electronic component vacuum portion 232, the above state is detected in such a manner that a pressure variation does not occur in the differential pressure detector 238.

In such a case, suction and peeling operation is stopped, and measures including removal of a target semiconductor element are taken. Semiconductor elements are progressively thinned and, therefore, warping or chipping tends to occur in the semiconductor elements. Thus, the above monitoring and detection of the state and measures are necessary.

Note that when the displacement based on expansion of the bellowphragm is small, a load cell may be used as a contact force detector.

2. Method of Peeling Electronic Component

As described above, a method of peeling an electronic component using the peeling apparatus 200 according to the aspects of the invention will be described in detail with reference to FIG. 3A to FIG. 10E.

FIG. 3A to FIG. 9 illustrate the process of peeling the semiconductor element 101 from the dicing tape 121 using the peeling apparatus 200.

Note that FIG. 3A to FIG. 7B schematically show a variation in area in which the dicing tape 121 contacts the adhesive agent 131 arranged on the rear surface of the semiconductor element 101.

That is, here, it is shown that the segmented semiconductor elements 101 are adhered and held on the surface of the sheet-like dicing tape 121 via the sheet-like adhesive agent 131 arranged on the rear surfaces of the semiconductor elements 101.

The semiconductor elements 101 are semiconductor elements that are segmented through a dicing process from a semiconductor substrate that is largely reduced in thickness through a back grinding process and is further thinned.

In this way, when the thinned semiconductor elements 101 are fixedly adhered on a support substrate such as a wiring substrate or an interposer via an adhesive agent, the semiconductor elements 101 may possibly be broken depending on a form in which the adhesive agent is arranged on the support substrate.

That is, in a state where the form of an adhesive agent that is arranged on the support substrate in advance is not flat, when the thin semiconductor elements are pressure-bonded on the adhesive agent, unevenness of the adhesive agent causes cracking, or the like, in the semiconductor elements. Thus, in advance of fixedly adhering the thin semiconductor elements to the support substrate such as a wiring substrate or an interposer, an adhesive agent is desirably arranged on the rear surfaces of the semiconductor elements.

For this reason, at the time of the dicing process following the back grinding process, first, the sheet-like adhesive agent 131, which is called a die bonding film, is adhered on the rear surface of the semiconductor substrate. Then, using the sheet-like adhesive agent 131, the semiconductor substrate is adhered on the dicing tape 121.

Note that after the above process, a back grinding tape (BG tape) adhered in the back grinding process on the upper surface of the semiconductor substrate is peeled off and removed.

In this way, the dicing process is performed on the semiconductor substrate that is adhered on the dicing tape 121 through the sheet-like adhesive agent 131 arranged on the rear surface of the semiconductor substrate, and then the segmented semiconductor elements, when peeled off from the dicing tape, are picked up in a state where the sheet-like adhesive agent is arranged on the rear surface of the semiconductor elements.

Because the sheet-like adhesive agent 131 is arranged on the rear surfaces of the semiconductor elements 101, when the semiconductor elements are mounted on the support substrate, it is not necessary to arrange an adhesive agent on the support substrate in advance and, therefore, the above described problem does not occur.

In the present embodiment, the dicing process is performed on the semiconductor substrate that is adhered on one of the main surfaces of the dicing tape 121 via the sheet-like adhesive agent 131, and then the semiconductor elements that are peeled off from the dicing tape are picked up in a state where the sheet-like adhesive agent is arranged on the rear surfaces of the semiconductor elements.

In addition, a variation over time in a state of arrangement of the vacuum unit 230, a pressure variation in the air chamber 213 of the bellowphragm 212, and the like, in the peeling process are shown in FIG. 10A to FIG. 10E.

Figure 10A:
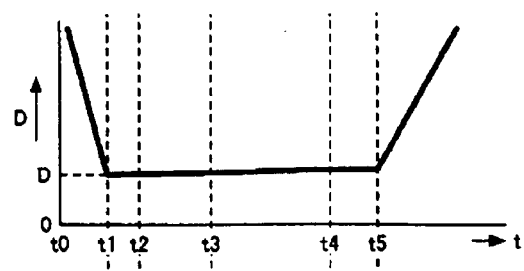
FIG. 10A to FIG. 10E are graphs for illustrating a method of peeling an electronic component according to the embodiment.
Figure 10B:
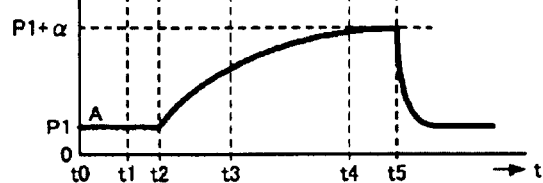
Figure 10C:
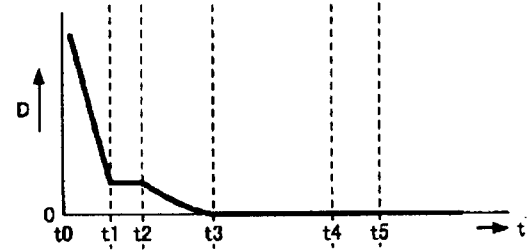
Figure 10D:
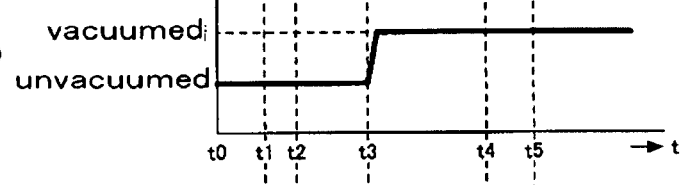
Figure 10E:
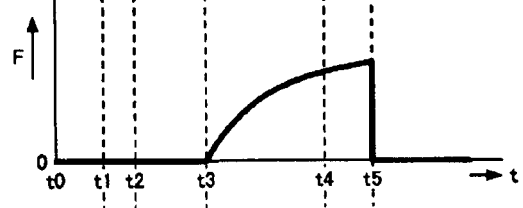

That is, FIG. 10A shows a variation over time in distance D between the vacuum unit 230 and the upper surface (initial plane) of the vacuumed semiconductor element before the peeling process is initiated. On the other hand, FIG. 10B shows a variation over time in pressure in the bellowphragm air chamber 213. Moreover, FIG. 10C shows a variation over time in distance between the electronic component vacuum portion 232 and the upper surface of the target semiconductor element in accordance with expansion and enlargement of the bellowphragm 212. Furthermore, FIG. 10D shows a variation over time in state in which the target semiconductor element is vacuumed to the electronic component vacuum portion 232. Yet furthermore, FIG. 10E shows a variation over time in pressing force applied to the electronic component vacuum portion 232 of the vacuum unit 230 across the target semiconductor element.

2-1. Positioning

In order to peel the target semiconductor element (hereinafter, simply referred to as semiconductor element) 101S, which is adhered on one of the main surfaces of the sheet-like dicing tape 121 via the sheet-like adhesive agent 131, from the dicing tape 121, first, the semiconductor element 101S is positioned on the bellowphragm accommodating portion 210 (time t0 in FIG. 10A to FIG. 10E). At this time, the air chamber 213 of the bellowphragm 212 in the bellowphragm accommodating portion 210 is applied with a pressure (pressure P1) from the electropneumatic regulator 216 so that the upper surface of the bellowphragm 212 has a level equal to that of the upper surface of the tape vacuum portion 220 and forms a common plane together with the upper surface of the tape vacuum portion 220 (see FIG. 10B). Note that if the above described form is obtained under a normal atmospheric pressure, pressurization is unnecessary.

Then, in the tape vacuum portion 220, the dicing tape 121 around the semiconductor element 101S is vacuumed (direction indicated by arrows A) through the through-holes 221 provided in the upper surface of the tape vacuum portion 220 to thereby fix the dicing tape 121.

On the other hand, the distal end portion of the electronic component vacuum portion 232 of the vacuum unit 230 is separated from the upper surface of the semiconductor element 101S and located opposite the semiconductor element 101S.

Figure 3A:
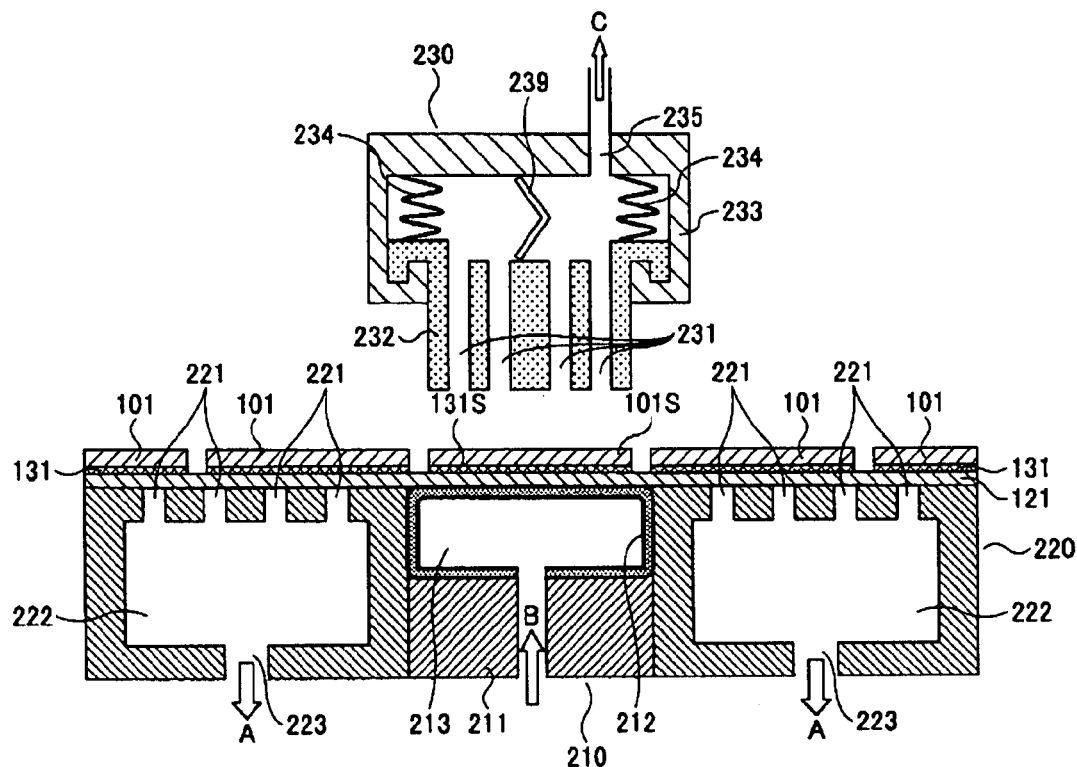
FIG. 3A and FIG. 3B are views that show the status of the peeling apparatus in a process of peeling a semiconductor element from a dicing tape and a state in which a peeling target semiconductor element is adhered to the dicing tape.

The above state is shown in FIG. 3A.

Figure 3B:
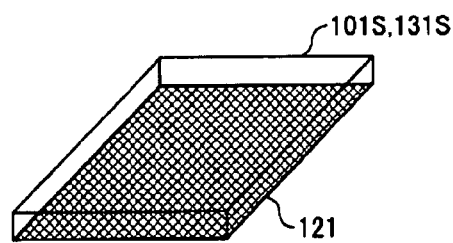

At this stage, the sheet-like adhesive agent 131 arranged on the rear surface of each semiconductor element 101S is in contact with the dicing tape 121 in all area (see FIG. 3B).

2-2. Lowering of Vacuum Unit

The thus positioned vacuum unit 230 is lowered so that the distal end portion of the electronic component vacuum portion 232 is located above the semiconductor element 101S at a predetermined distance D (D ranges from 0.1 mm to 0.3 mm) from the plane (initial plane S) that includes the upper surface of the semiconductor element 101S (time t1 in FIG. 10A to FIG. 10E). Then, the support portion 233 of the vacuum unit 230 is fixedly located at a predetermined distance from the plane (initial plane S) that includes the upper surface of the semiconductor element 101. That is, the support portion 233 is fixedly located at a distance DS from the initial plane S to the upper surface of the support portion 233.

Figure 4A:
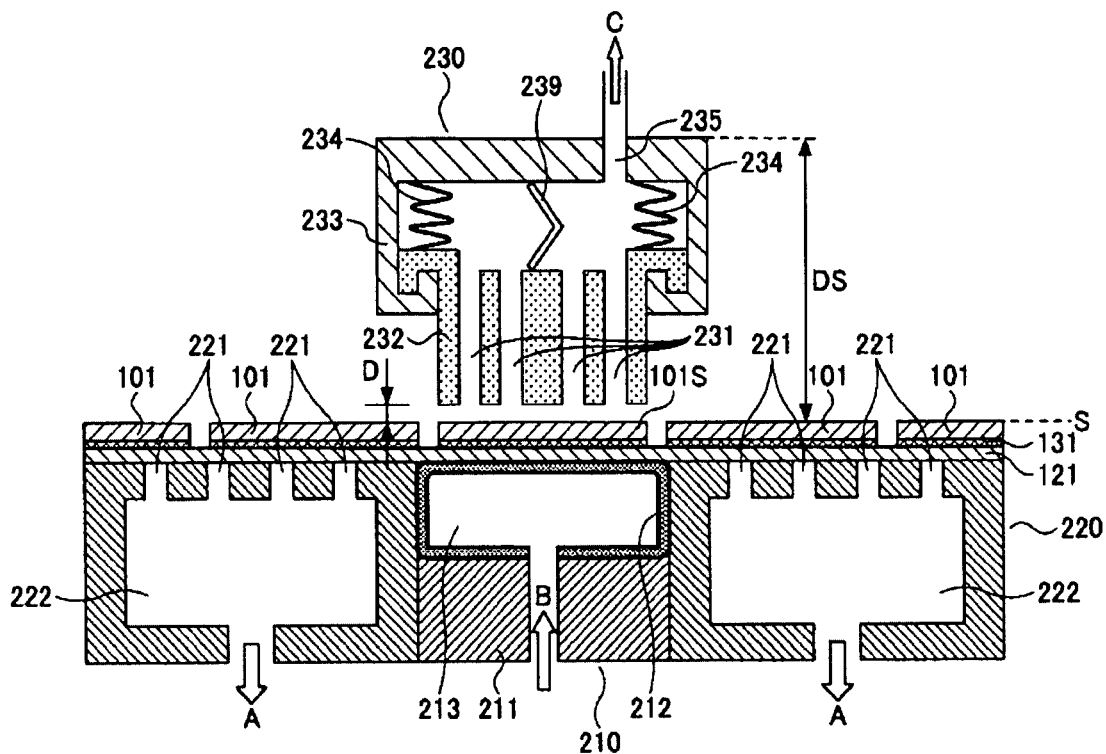
FIG. 4A and FIG. 4B are views that show the status of the peeling apparatus in the process of peeling the semiconductor element from the dicing tape and a state in which the peeling target semiconductor element is adhered to the dicing tape.
Figure 4B:
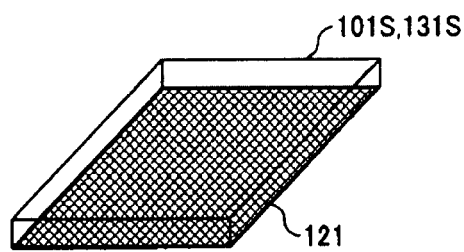

The above state is shown in FIG. 4A.

Then, vacuuming of the inside of the vacuum unit 230 is initiated, and outside air flows in through the through-holes 231 (direction indicated by arrow C in the drawing). In the above state, the sheet-like adhesive agent 131S arranged on the rear surface of the semiconductor element 101S is adhered on the dicing tape 121 in entire area (see FIG. 4B).

2-3. Initiation of Peeling Process

Figure 5A:
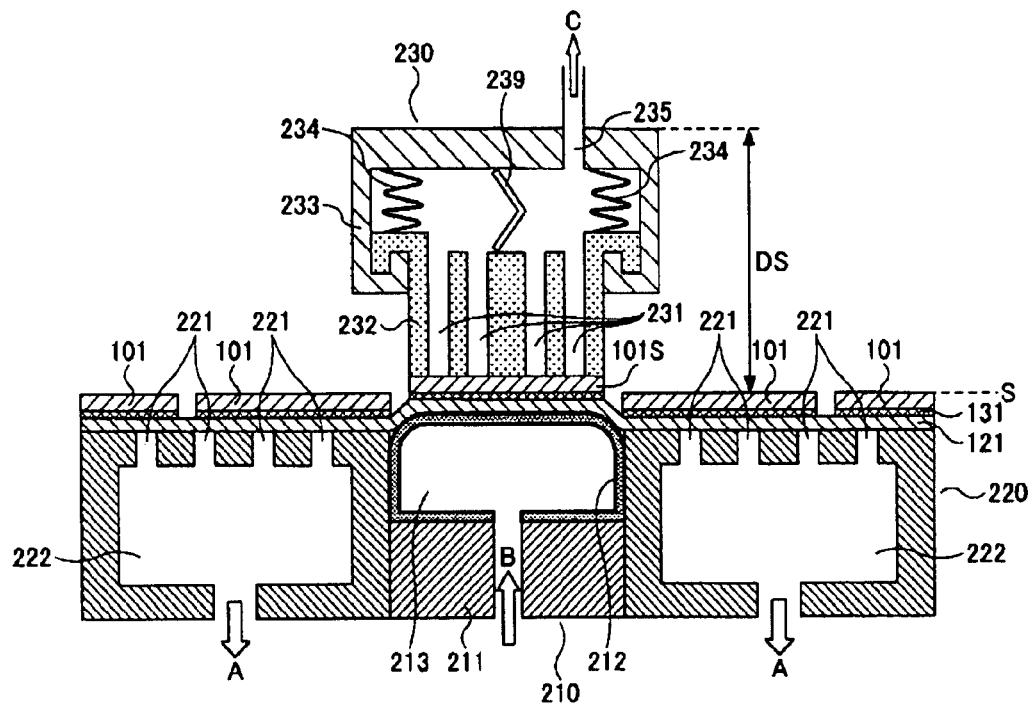
FIG. 5A and FIG. 5B are views that show the status of the peeling apparatus in the process of peeling the semiconductor element from the dicing tape and a state in which the peeling target semiconductor element is adhered to the dicing tape.

Subsequently, by activating the electropneumatic regulator 216, air is started to be introduced into the air chamber 213 of the bellowphragm 212 under pressure to thereby increase the pressure in the bellowphragm air chamber 213 (P1+α). By so doing, the bellowphragm air chamber 213 is expanded and enlarged to raise the upper surface of the bellowphragm 212 (time t2 in FIG. 10A to FIG. 10E). In accordance with a rise in the upper surface of the bellowphragm 212, the semiconductor element 101S located on that upper surface is moved (raised) by a distance D, and the upper surface of the semiconductor element 101S contacts the distal end portion (lower end portion) of the electronic component vacuum portion 232 of the vacuum unit 230 (time t3 in FIG. 10A to FIG. 10E). The above state is shown in FIG. 5A.

As described above, the electronic component vacuum portion 210 has already initiated vacuuming, and, therefore, the semiconductor element 101S is vacuumed to the distal end portion of the electronic component vacuum portion 232.

That is, by vacuuming the semiconductor element 101S, the openings of the distal end portion of the electronic component vacuum portion 232, that is, the plurality of through-holes 231, are all closed (see FIG. 10C). Thus, the inside of the vacuum unit 230 is further decreased in pressure, and the electronic component vacuum portion 232 is slightly moved (raised) inside the support portion 233 against the springs 234.

As a result, the electronic component vacuum portion 232 contacts the strain gauge 239, and it is detected that the semiconductor element 101S is vacuumed to the distal end portion (lower end portion) of the electronic component vacuum portion 232.

In addition, the differential pressure detector 238 detects whether the semiconductor element 101S is vacuumed normally, that is, whether the semiconductor element 101S is vacuumed so that it closes all the plurality of through-holes 231 of the distal end portion of the electronic component vacuum portion 232.

Note that when the semiconductor element 101S contacts the distal end portion of the electronic component vacuum portion 232 so that it is inclined to the plane of the distal end portion, it requires more time until complete vacuuming is performed.

At this time, in accordance with expansion and enlargement of the bellowphragm air chamber 213, the upper surface of the bellowphragm 212 rises while forming a substantially circular arc side surface.

Figure 5B:
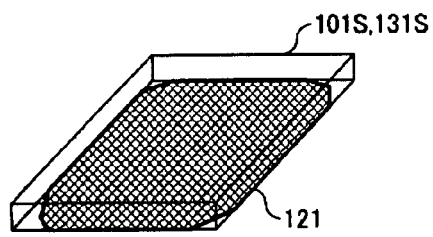

By so doing, the sheet-like adhesive agent 131S on the lower surface of the semiconductor element 101S initially peels off from the dicing tape 121 at the four corner portions of the semiconductor element 101 (see FIG. 5B). Note that in this way, in order to vacuum and hold the semiconductor element 101S at the distal end portion (lower end portion) of the electronic component vacuum portion 232 of the vacuum unit 230, a distance D between the upper surface of the semiconductor element 101S and the distal end portion of the electronic component vacuum portion 232, a distance (D+β) that is necessary for the sheet-like adhesive agent 131S arranged on the rear surface of the semiconductor element 101S to be peeled off from the dicing tape 121, an air pressure (P1+α) that is introduced into the bellowphragm air chamber 213, the pressurizing rate, and the like, are set in advance.

These are set on the basis of strength, coefficient of extension, and adhesion based on the material of the dicing tape 121, the thickness of the dicing tape 121, the material of the sheet-like adhesive agent 131, and the like.

For example, when the dicing tape 121 easily extends and has a high adhesive, a pressure in the bellowphragm air chamber 213 is set to be higher or the distance D between the distal end portion of the semiconductor element vacuum portion 232 and the upper surface of the semiconductor element 101 is set to be longer.

In addition, when the dicing tape 121 has a low adhesive, peeling of the sheet-like adhesive agent 131 beneath the semiconductor element 101 is initiated by slightly raising the upper surface of the bellowphragm air chamber 213. Thus, a pressure in the bellowphragm air chamber 213 is set to be lower, or the distance D between the lower end portion of the semiconductor element vacuum portion 232 and the upper surface of the semiconductor element 101 is set to be shorter.

2-4. Progress of Peeling Process

As described above, in accordance with introduction (pressurization) of air into the bellowphragm air chamber 213, the bellowphragm 212 further expands or enlarges and the upper surface of the bellowphragm 212 continues to rise.

In accordance with the rise in upper surface of the bellowphragm 212, the semiconductor element 101S is pushed up, the electronic component vacuum portion 232 that is vacuuming the semiconductor element 101S further rises inside the support portion 233 against the springs 234, and then the surface of the semiconductor element 101S reaches a position (D+β).

As a result, the semiconductor element 101S and the sheet-like adhesive agent 131S arranged on the rear surface of the semiconductor element 101S are further peeled from the dicing tape 121.

Figure 6A:
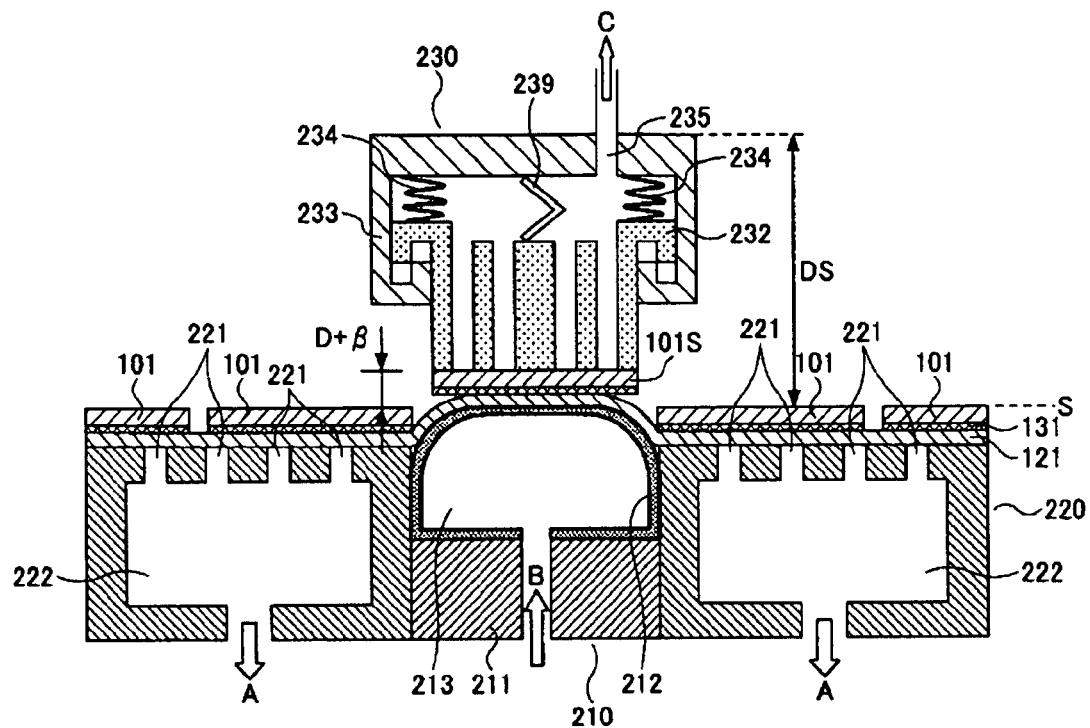
FIG. 6A and FIG. 6B are views that show the status of the peeling apparatus in the process of peeling the semiconductor element from the dicing tape and a state in which the peeling target semiconductor element is adhered to the dicing tape.

The above state is shown in FIG. 6A.

Figure 6B:
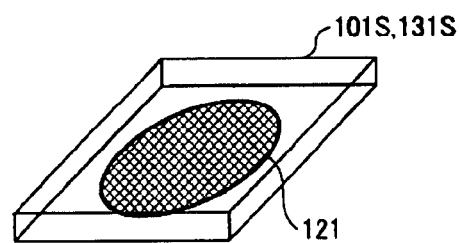

At this time, the sheet-like adhesive agent 131S arranged on the rear surface of the semiconductor element 101S is peeled off from the dicing tape 121 at not only the four corner portions of the semiconductor element 101S but also at portions located in proximity to the four sides of the semiconductor element 101S (see FIG. 6B). Peeling of the sheet-like adhesive agent 131S from the dicing tape 121 progresses from the four corner portions of the semiconductor element 101S and portions in proximity to the four sides thereof toward the center portion of the semiconductor element 101S.

Then, the pressure in the bellowphragm air chamber 213 rises over time, so that the semiconductor element 101S further rises and the electronic component vacuum portion 232 further rises inside the support portion 233 against the springs 234.

Figure 7A:
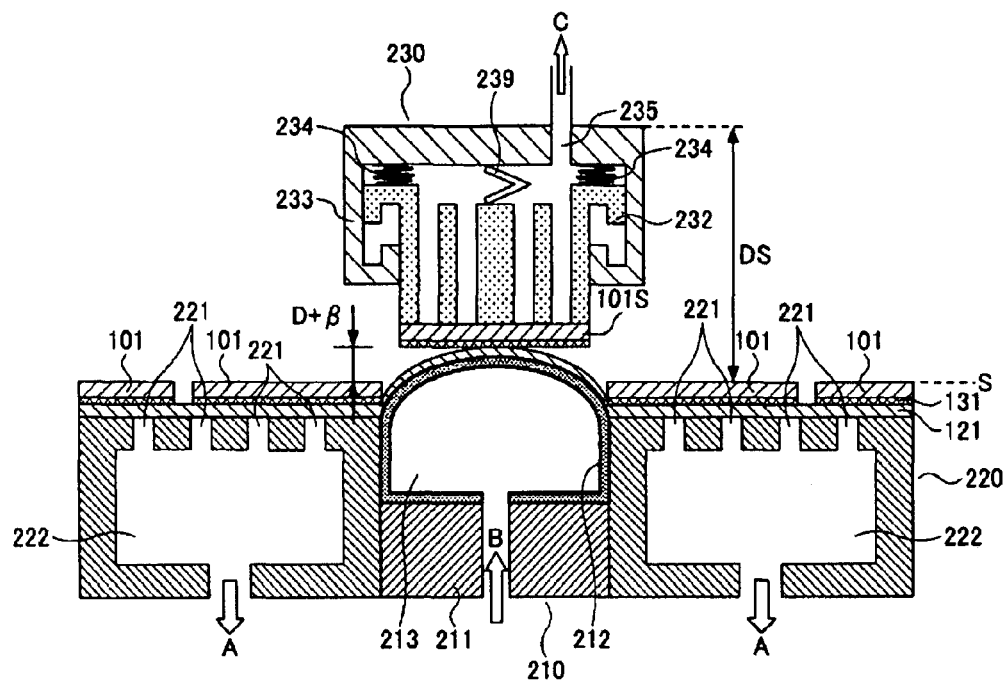
FIG. 7A and FIG. 7B are views that show the status of the peeling apparatus in the process of peeling a semiconductor element from the dicing tape and a state in which the peeling target semiconductor element is adhered to the dicing tape.

Then, the rear surface of the semiconductor element 101S substantially reaches a predetermined position (D+β) (time t4 in FIG. 10A to FIG. 10E). The above state is shown in FIG. 7A.

Figure 7B:
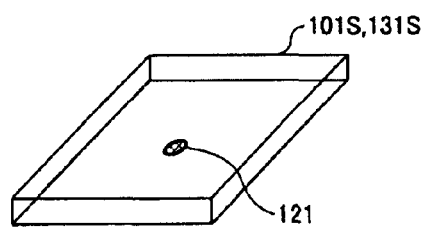

As a result, the sheet-like adhesive agent 131S arranged on the rear surface of the semiconductor element 101S contacts the dicing tape 121 in a substantially point-like manner, that is, in a minimum area at the substantially center portion of the rear surface of the semiconductor element 101S (see FIG. 7B).

2-5. Separation of Adhesive Agent from Dicing Tape

After that, the vacuum unit 230 is raised, and the upper surface of the semiconductor element 101S that is vacuumed and held at the distal end portion (lower end portion) of the electronic component vacuum portion 232 is raised to a position above the predetermined position (D+β).

On the other hand, air in the bellowphragm air chamber 213 is discharged to decrease the internal pressure, thus reducing the level of the upper surface of the bellowphragm 212 (time t5 in FIG. 10A to FIG. 10E). That is, the position of the support portion 233 of the vacuum unit 230 is fixed between time t1 to time t5.

Through these operations, the semiconductor element 101S together with the sheet-like adhesive agent 131S arranged on the rear surface of the semiconductor element 101S is peeled off from the dicing tape 121.

As a result, the semiconductor element 101S is vacuumed and held at the distal end portion (lower end portion) of the electronic component vacuum portion 232.

Note that the electronic component vacuum portion 232, because the pressing force applied by the bellowphragm 212 across the semiconductor element 101S vacuumed to the distal end of the electronic component vacuum portion 232 is eliminated, is pushed down by the springs 234 inside the support portion 233.

Then, the vacuum unit 230 that is vacuuming and holding the semiconductor element 101S is driven by a drive mechanism (not shown) to transport the semiconductor element 101S to a die bonding process in which the semiconductor element 101S is bonded to a substrate such as a lead frame or a printed substrate or to a transport tray.

On the other hand, portion of the dicing tape 121, at which the semiconductor element 101S is held, is reduced in level to form a plane that is substantially continuous to portion of the dicing tape vacuumed to the tape vacuum portion 220.

Figure 8:
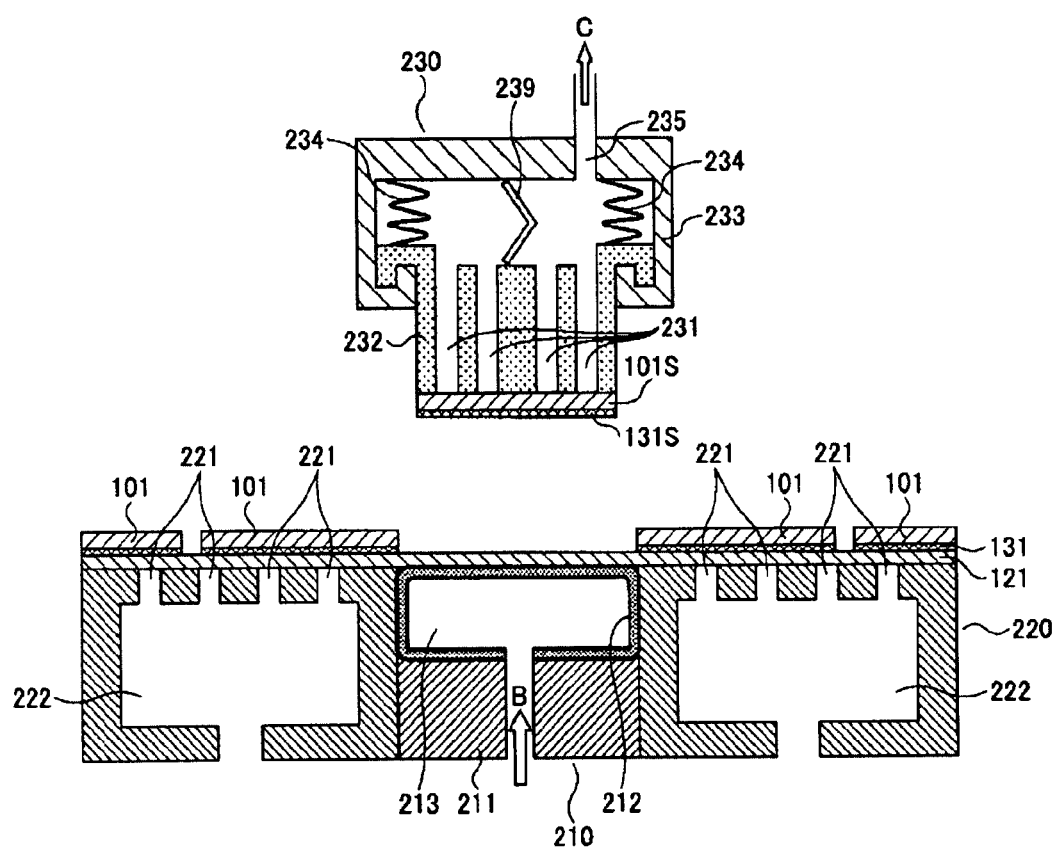
FIG. 8 is a view that shows the status of the peeling apparatus in the process of peeling the semiconductor element from the dicing tape.

The above state is shown in FIG. 8.

2-6. Subsequent Peeling Process for Semiconductor Element

In a state where the above described plane is formed, vacuuming of the dicing tape 121 by the tape vacuum portion 220 is stopped to release the vacuumed state.

After that, the dicing tape 121 is moved in a lateral direction to thereby place a semiconductor element 101N, which is the next peeled target, on the bellowphragm air chamber 213.

Figure 9:
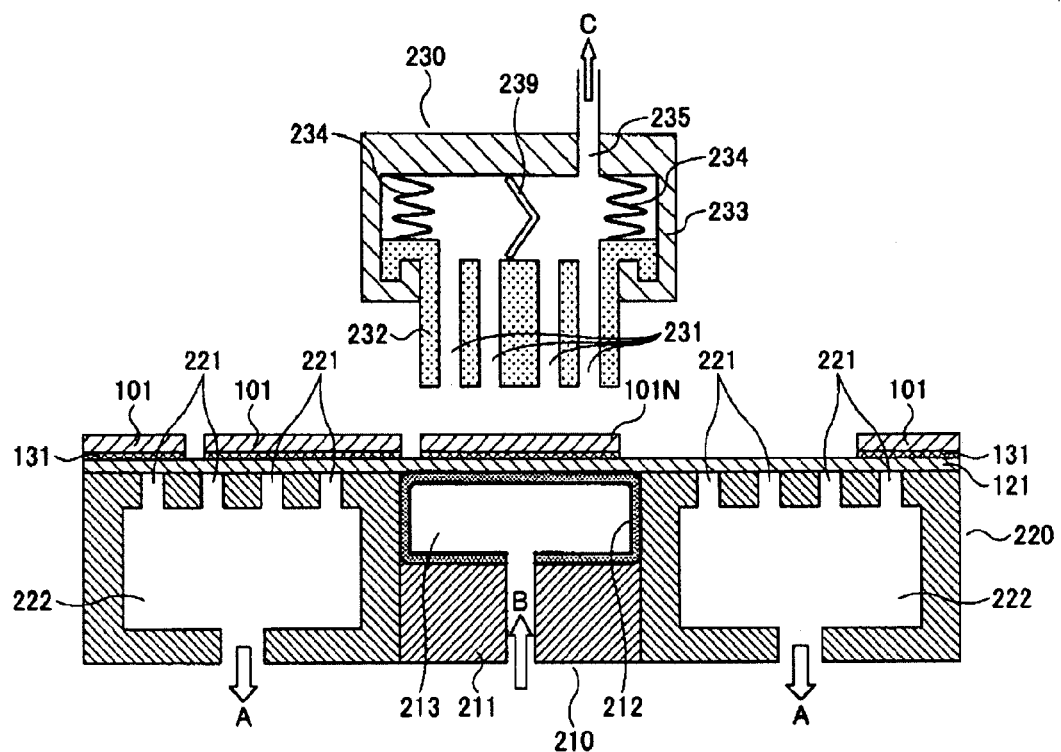
FIG. 9 is a view that shows the status of the peeling apparatus in the process of peeling the semiconductor element from the dicing tape.

The above state is shown in FIG. 9.

Then, by executing positioning and lowering of the vacuum unit 230 and pressurization and expansion of the bellowphragm 212 as described above, the process of peeling the peeled target semiconductor element 101N from the dicing tape 121 is performed.

In the peeling process for the semiconductor element according to the aspects of the invention, a pressure in the bellowphragm air chamber 212 and a vacuumed state of the semiconductor element at the electronic component vacuum portion 232 of the vacuum unit 230 are monitored by the strain gauge 239 and the differential pressure detector 238.

For example, the rate of rise per unit time in pressure in the bellowphragm air chamber 212 is detected by the strain gauge 239. By so doing, it is detected whether a force by which the semiconductor element 101 contacts the electronic component vacuum portion 232 desirably varies over time.

By detecting the force by which the semiconductor element 101 contacts the electronic component vacuum portion 232 using the strain gauge 239, it is possible to understand how the semiconductor element 101 is vacuumed to the electronic component vacuum portion 232 and, therefore, it is possible to take necessary measures.

For example, when a value of the force by which the semiconductor element 101 contacts the electronic component vacuum portion 232 exceeds a predetermined value, the electropneumatic regulator 216 is actuated by the control unit 240 to decrease the pressure in the bellowphragm air chamber 212 or a drive mechanism (not shown) is actuated to raise the electronic component vacuum portion 232 to thereby separate the semiconductor element 101 from the electronic component vacuum portion 232, thus preventing breakage of the semiconductor element 101.

In addition, when the pressure in the semiconductor element vacuum unit 230 does not decrease on the basis of the result detected by the differential pressure detector 238 although a force, detected by the strain gauge 239, by which the semiconductor element 101 contacts the electronic component vacuum portion 232, is larger than or equal to a predetermined value, it is determined that the semiconductor element 101 is not normally vacuumed to portions of the through-holes 231 of the electronic component vacuum portion 232.

That is, in that case, there is a possibility that the semiconductor element 101 may be in contact with the portions of the through holes 231 of the electronic component vacuum portion 232 with its inclined or rotated, or may be broken.

Then, when a series of cycles of the peeling operation according to the aspects of the invention falls within a predetermined range, that is, a variation over time in position of the vacuum unit 230, which is a variation over time in the distance D between the lower end surface of the electronic component vacuum portion 232 of the vacuum unit 230 and a plane (initial plane S) on which the upper surface (vacuumed surface) of the semiconductor element 101 located below the electronic component vacuum portion 232, a state, detected by the differential pressure detector 238, in which the semiconductor element 101 is vacuumed to the lower end surface of the electronic component vacuum portion 232 of the vacuum unit 230, a variation in pressure over time in the bellowphragm air chamber 213, and a variation over time in force, detected by the strain gauge 239, by which the semiconductor element 101 contacts the electronic component vacuum portion 232, are similar to the variations shown in FIG. 10A to FIG. 10E, it may be regarded that the semiconductor element 101 is normally peeled off from the dicing tape 121.

On the other hand, when a series of cycles of the peeling operation according to the aspects of the invention falls outside the predetermined range, it is determined that abnormality is occurring, and then it is possible to take measures, for example, stopping the operation of the peeling apparatus 200 to deal with it.

For example, if the timing, detected by the strain gauge 239, at which the semiconductor element 101 contacts the lower end surface of the electronic component vacuum portion 232 (time t3 in FIG. 10A to FIG. 10E) and the timing, detected by the differential pressure detector 238, at which the semiconductor element 25 is vacuumed to the lower surface of the semiconductor element vacuum portion 232 (time t4 in FIG. 10A to FIG. 10E) are earlier than a predetermined timing, it is determined that abnormality that the semiconductor element 101 has been already peeled off before the peeling operation of the semiconductor element 101 is initiated is occurring. Then, by stopping the operation of the peeling apparatus 200, or the like, the occurrence of breakage in the semiconductor element 101 is prevented.

In addition, when the timing, detected by the differential pressure detector 238, at which the semiconductor element 101 is vacuumed to the lower surface of the electronic component vacuum portion 232 (time t4 in FIG. 10A to FIG. 10E) is later than the predetermined timing, it is determined that the semiconductor element 101 is firmly adhered to the dicing tape 121 as compared to the predetermined state and, therefore, it is difficult to peel off the semiconductor element 101 from the dicing tape 121. Then, by stopping the operation of the peeling apparatus 200, or the like, the occurrence of breakage in the semiconductor element 101 is prevented.

In this way, according to the peeling method and peeling apparatus for the electronic component of the aspects of the invention, the entire upper surface of the bellowphragm 212 that is substantially equal to or slightly larger in size than the semiconductor element 101 rises to raise the semiconductor element 101 adhered on the dicing tape 121. Thus, a force that causes the semiconductor element 101 to be peeled off from the dicing tape 121 is applied to the entire back surface (lower surface) of the semiconductor element 101 from the entire upper surface of the bellowphragm 212.

Thus, in comparison with the mode in which the semiconductor element 101 is peeled off from the dicing tape using needles as in the case of the existing art, it is possible to reduce (disperse) the stress that arises at the time of the peeling.

Thus, it is possible to reduce damage given to the semiconductor element 101, and it is possible to stably perform peeling without leading to deterioration of the form at the time when the semiconductor element 101 is peeled off from the dicing tape.

In addition, in the peeling method and peeling apparatus for the electronic component of the aspects of the invention, it is detected on the basis of a vacuumed state in the vacuum unit 230 whether the semiconductor element is normally vacuumed to the lower end surface of the through-holes 231 of the electronic component vacuum portion 232.

On the other hand, a force by which the semiconductor element 101 contacts the electronic component vacuum portion 232 of the vacuum unit 230 is detected by the strain gauge 239.

On the basis of these detected results, it is determined whether the peeling operation is in an abnormal state, and it is possible to take measures, for example, by stopping the operation of the peeling apparatus. Thus, it is possible to prevent and suppress the occurrence of breakage in the semiconductor element 101.

Note that the aspects of the invention are not limited to the embodiment described above, but they may be modified into various forms within the scope of the invention recited in the appended claims.

That is, in the peeling apparatus 200 according to the above embodiment, the bellowphragm accommodating portion 210 and the tape vacuum portion 220 that is arranged to surround the bellowphragm accommodating portion 210 are separately provided; instead, the bellowphragm accommodating portion and the tape vacuum portion may be integrally formed.

Because the upper surface of the bellowphragm air chamber 212 in the bellowphragm accommodating portion 210 has a shape and area corresponding to the shape and area of the target semiconductor element, the tape vacuum portion 220 that is located to surround the bellowphragm accommodating portion 210 also desirably has a shape and area corresponding to the shape and area of the target semiconductor element.

In view of the above, by integrally forming the bellowphragm accommodating portion and the tape vacuum portion in a common base as a unit configuration to conform to the type of the target semiconductor element, it is possible to provide an efficient peeling process and improve yield.

In addition, in the above embodiment, a signal bellowphragm is used for a peeled target semiconductor element that is adhered on a dicing film, and the semiconductor element is peeled off from the dicing film through expansion and enlargement of the bellowphragm; instead, the bellowphragm may have the following configuration.

Figure 11:
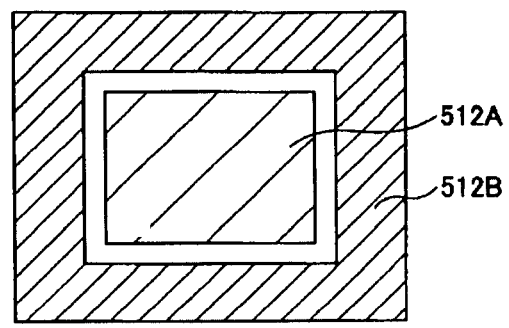
FIG. 11 is a plan view of a bellowphragm air chamber of a first alternative example of a peeling apparatus for an electronic component according to the embodiment.

For example, as shown in FIG. 11, the bellowphragm has a double-layer structure as the configuration of arrangement as viewed in plan and is formed of a first bellowphragm 512A and a second bellowphragm 512B that is separated from the first bellowphragm 512A and arranged to surround the first bellowphragm 512A.

The planar shape and area formed by these bellowphragms are substantially equal to the shape and area of the peeled target semiconductor element. The area may be slightly larger.

Then, the bellowphragm 512A and the bellowphragm 512B are connected to the electropneumatic regulator independently of each other.

In this way, when the semiconductor element is peeled using the double-layer bellowphragm as the configuration of arrangement as viewed in plan, the air chamber of the bellowphragm 512B is first expanded and enlarged to push up the dicing tape, which is located below the peripheral portion of the semiconductor element, to a predetermined level to peel the adhesive agent arranged at the peripheral portion of the semiconductor element from the dicing tape.

After that, the air chamber of the bellowphragm 512A is expanded and enlarged to push up the substantially center portion of the target semiconductor element, thus peeling the adhesive agent arranged at the center portion of the semiconductor element from the dicing tape.

According to the above configuration of arrangement of the bellowphragm, because the peripheral portion of the target semiconductor element is substantially uniformly pushed up by the bellowphragm 512B, it is possible to disperse the stress that arises against the pressing and, therefore, it is possible to prevent breakage of the semiconductor element.

In addition, by arranging the bellowphragm 512A inside the bellowphragm 512B independently of each other, it is possible to reliably peel the adhesive agent arranged at the center portion of the semiconductor element.

Figure 12:
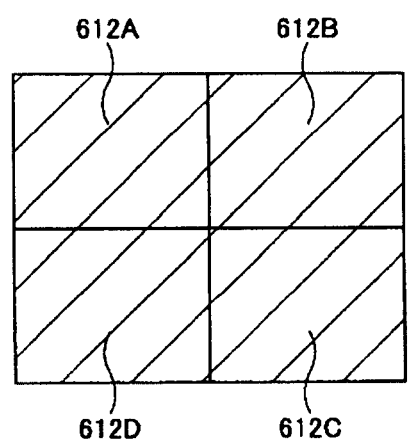
FIG. 12 is a plan view of a bellowphragm air chamber of a second alternative example of a peeling apparatus for an electronic component according to the embodiment of the invention.

In addition, as shown in FIG. 12, the bellowphragm may be separated into four as the configuration of arrangement as viewed in plan, and is formed of bellowphragms 612A to 612D that are arranged in a grid. The upper surfaces of bellowphragms 612A to 612D have the same shape and area. The planar shape and area formed by these bellowphragms is substantially equal to the shape and area of the rear surface of the peeled target semiconductor element. The area formed by these bellowphragms may be slightly larger.

In addition, the bellowphragms 612A to 612D are connected to the electropneumatic regulator independently of one another.

According to the above configuration of arrangement of the bellowphragm, because the bottom surface of the target semiconductor element may be substantially uniformly pushed up by the plurality of bellowphragms 612, it is possible to disperse the stress that arises against the pressing. Thus, it is possible to prevent breakage of the semiconductor element.

In addition, when peeling of the semiconductor element at a specific portion does not proceed, by proceeding with expansion and enlargement of the bellowphragm located below that portion, it is possible to perform peeling at that portion.

Furthermore, the aspects of the invention may be applied to any one of a mode in which the dicing tape has no adhesive and an electronic component such as a segmented semiconductor element is adhered on the dicing tape with an adhesive agent or a mode in which an electronic component is adhered on the dicing tape having an adhesive surface.

All examples and conditional language recited herein are intended for pedagogical purposes to aid the reader in understanding the invention and the concept contributed by the inventor to furthering the art, and are to be construed as being without limitation to such specifically recited examples and conditions, nor does the organization of such examples in the specification related to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method of peeling an electronic component, comprising:
   bringing a bellowphragm into contact with a second main surface, which is a main surface of a tape member, when the electronic component is adhered onto a first main surface of the tape member, the first main surface is another main surface of the tape member; and
   after the bellowphragm is brought into contact with the second main surface, deforming the bellowphragm and the tape member by supplying a fluid to the bellowphragm, so as to perform peeling the electronic component from the tape member while the electronic component is being vacuumed and held by a vacuum device; and
   detecting a rate of rise per unit time in pressure inside the bellowphragm by a gauge to measure a contact force by which the electronic component contacts the vacuum device.

2. The method of peeling the electronic component according to claim 1, wherein in the peeling the electronic component from the tape member, the electronic component is raised through deformation of the bellowphragm and the tape member.

3. The method of peeling the electronic component according to claim 1, further comprising:
   arranging the vacuum device above the bellowphragm so that a distance between the vacuum device and the electronic component becomes a predetermined distance;
   pressurizing the inside of the bellowphragm so that a pressure inside the bellowphragm becomes a predetermined pressure; and
   initiating vacuuming of the electronic component by the vacuum device after the electronic component contacts the vacuum device.

4. The method of peeling the electronic component according to claim 3, wherein the predetermined distance between a lower surface of the vacuum portion of the vacuum device and an upper surface of the electronic component and the predetermined pressure inside the bellowphragm are determined on the basis of a characteristic of the tape member.

5. The method of peeling the electronic component according to claim 1, wherein the measuring the vacuumed state between the vacuum device and the electronic component includes: obtaining a vacuum pressure generated by the vacuum device and the contact force by which the electronic component contacts the vacuum device; and controlling a pressure inside the bellowphragm and a position of the vacuum device on the basis of the vacuum pressure and the contact force.

6. The method of peeling the electronic component according to claim 5, wherein when the contact force by which the electronic component contacts the vacuum device exceeds a predetermined value and it is detected that an inside of the vacuum device is not in a vacuum state, it is determined that an abnormal state is occurring.

7. The method of peeling the electronic component according to claim 5, wherein when a timing at which the electronic component contacts a lower surface of the vacuum device and a timing at which the electronic component is vacuumed to the lower surface of the vacuum device are earlier than a predetermined timing, it is determined that an abnormal state is occurring.

8. The method of peeling the electronic component according to claim 5, wherein a timing at which the electronic component is vacuumed to a lower surface of the vacuum device is later than a predetermined timing, it is determined that an abnormal state is occurring.

9. The method of peeling the electronic component according to claim 1, wherein the bellowphragm includes a plurality of bellowphragm components, and wherein each of the bellowphragm components is activated in accordance with a state in which the electronic component is peeled from the tape member.

10. The method of peeling the electronic component according to claim 5, wherein the detecting the vacuum pressure generated by the vacuum device is performed by a differential pressure detector and the detecting the contact force by which the electronic component contacts the vacuum device is performed by the gauge that is arranged between a lower surface of the vacuum device and a support of the vacuum device.

* * * * *